(12) United States Patent
Sugino et al.

(10) Patent No.: US 11,609,133 B2
(45) Date of Patent: Mar. 21, 2023

(54) SEMICONDUCTOR STRAIN DETECTION ELEMENT WITH IMPURITY DIFFUSION LAYER

(71) Applicant: Mitsubishi Electric Corporation, Tokyo (JP)

(72) Inventors: Takaki Sugino, Tokyo (JP); Koji Tanimoto, Tokyo (JP); Yuji Kawano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 500 days.

(21) Appl. No.: 16/799,147

(22) Filed: Feb. 24, 2020

(65) Prior Publication Data

US 2020/0378848 A1 Dec. 3, 2020

(30) Foreign Application Priority Data

May 30, 2019 (JP) .............................. JP2019-100926

(51) Int. Cl.
*G01L 1/22* (2006.01)
*B81B 3/00* (2006.01)
*H01L 29/24* (2006.01)

(52) U.S. Cl.
CPC .......... *G01L 1/2287* (2013.01); *B81B 3/0086* (2013.01); *G01L 1/2206* (2013.01); *H01L 29/24* (2013.01); *B81B 2201/03* (2013.01)

(58) Field of Classification Search
None
See application file for complete search history.

(56) References Cited

U.S. PATENT DOCUMENTS

| 5,291,788 A * | 3/1994 | Oohata ................. G01L 9/0054 73/756 |
| 5,643,803 A | 7/1997 | Fukada et al. |
| 2006/0207339 A1* | 9/2006 | Sumigawa ............... G01B 7/18 73/777 |

(Continued)

FOREIGN PATENT DOCUMENTS

| JP | 6-102108 A | 4/1994 |
| JP | 6-204408 A | 7/1994 |

(Continued)

OTHER PUBLICATIONS

Communication dated Dec. 8, 2020, from the Japanese Patent Office in Application No. 2019-100926.

(Continued)

*Primary Examiner* — Lisa M Caputo
*Assistant Examiner* — Nigel H Plumb
(74) *Attorney, Agent, or Firm* — Sughrue Mion, PLLC; Richard C. Turner (57) ABSTRACT

An object is to reduce the influence of noise due to electric conduction carriers trapped between the surface of a silicon substrate and an oxide and thus achieve strain detection with a high S/N ratio. This semiconductor strain detection element includes: a silicon substrate; and a first impurity diffusion layer having a conduction type different from the silicon substrate, the first impurity diffusion layer being formed inside under a surface of the silicon substrate, wherein an amount of strain in the silicon substrate is detected on the basis of change in a resistance of the first impurity diffusion layer.

15 Claims, 6 Drawing Sheets

(56) References Cited

U.S. PATENT DOCUMENTS

| | | | | |
|---|---|---|---|---|
| 2007/0228500 A1* | 10/2007 | Shimazu | ................ | G01B 7/18 |
| | | | | 257/417 |
| 2013/0228022 A1* | 9/2013 | Brown | ................ | G01L 9/0054 |
| | | | | 73/862.68 |
| 2015/0276517 A1* | 10/2015 | Ashida | ................ | G01L 1/2293 |
| | | | | 73/862.045 |

FOREIGN PATENT DOCUMENTS

| | | |
|---|---|---|
| JP | 7-131035 A | 5/1995 |
| JP | 8-18070 A | 1/1996 |
| JP | 2010025698 A | 2/2010 |
| JP | 2011-124344 A | 6/2011 |

OTHER PUBLICATIONS

Office Action dated Jan. 18, 2022 in German Application No. 10 2020 205 274.3.
Communication dated Aug. 4, 2020, from the Japanese Patent Office in application No. 2019-100926.

* cited by examiner

SEMICONDUCTOR STRAIN DETECTION ELEMENT WITH IMPURITY DIFFUSION LAYER

BACKGROUND OF THE INVENTION

1. Field of the Invention

The present disclosure relates to a semiconductor strain detection element having an impurity diffusion layer formed in a silicon substrate, and a MEMS actuator device including the same.

2. Description of the Background Art

Micro sensing devices using technology of micro electro mechanical systems (MEMS) are being developed, and with advancement of MEMS technology, semiconductor strain detection elements used as an acceleration sensor, a pressure sensor, and a mechanical sensor are required to have an improved S/N ratio.

Patent Document 1: Japanese Laid-Open Patent Publication No. 6-102108

Patent Document 2: Japanese Laid-Open Patent Publication No. 2011-124344

In a semiconductor strain detection element such as a piezoelectric resistor element, for example, impurities are added to a P-type silicon substrate, to form an impurity diffusion layer that enables strain detection based on change in the resistance of the substrate surface.

In this semiconductor strain detection element, in order to enhance sensitivity of the impurity diffusion layer, a separated oxide film for suppressing an influence from another element therearound is required to be formed, and in order to protect the impurity diffusion layer that detects the resistance change, an insulation oxide film needs to be provided on the surface.

However, multiple trap levels exist in the interface between the semiconductor surface and the oxide film, and electric conduction carriers are trapped, to cause carrier fluctuation, which is observed as noise. Therefore, in the case of using a semiconductor strain detection element such as a piezoelectric resistor element for a MEMS actuator device, the S/N ratio is deteriorated, thus causing a problem that it is impossible to perform angle detection with high sensitivity.

SUMMARY OF THE INVENTION

The present disclosure has been made to solve the above problem, and an object of the present disclosure is to obtain a semiconductor strain detection element that is hardly influenced by noise from outside and thus has a high S/N ratio.

A semiconductor strain detection element according to one aspect of the present disclosure includes: a silicon substrate; and a first impurity diffusion layer having a conduction type different from the silicon substrate, the first impurity diffusion layer being formed inside under a surface of the silicon substrate, wherein an amount of strain in the silicon substrate is detected on the basis of change in a resistance of the first impurity diffusion layer.

The semiconductor strain detection element according to one aspect of the present disclosure can perform strain detection with a high S/N ratio without being influenced by noise from outside.

DETAILED DESCRIPTION OF THE PREFERRED

Embodiments of the Invention

In the descriptions of embodiments and drawings, the same or corresponding parts are denoted by the same reference characters.

First Embodiment

In the first embodiment of the present disclosure, the structure of a semiconductor strain detection element will be described with reference to FIG. 1 to FIG. 3, and a process for manufacturing the semiconductor strain detection element will be described with reference to FIG. 4A to FIG. 5C. Further, an impurity ion density distribution in the semiconductor strain detection element according to the first embodiment will be described with reference to FIG. 6 and FIG. 7.

<Schematic Structure of Semiconductor Strain Detection Element>

Figure 1:
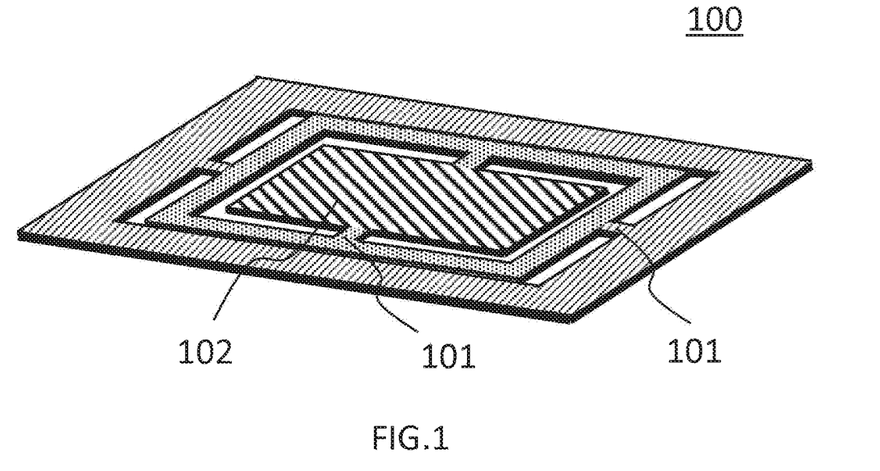
FIG. 1 is a bird's-eye view of a MEMS actuator device.

FIG. 1 is a bird's-eye view of a MEMS actuator device to which the semiconductor strain detection element according to the present embodiment is applied. FIG. 2 shows the schematic structure of the semiconductor strain detection element. FIG. 3 shows a sectional structure at part A-A' in FIG. 2.

In FIG. 1, a MEMS actuator device 100 using a micro-mirror 102 has the micro-mirror 102 at a center part of the device, and is formed by a duplex silicon substrate surrounding the micro-mirror 102. At each of a plurality of support portions 101 which are portions connecting the duplex silicon substrate, a semiconductor strain detection element (not shown) is formed.

By the plurality of semiconductor strain detection elements formed at the support portions 101, vibration strains in the longitudinal direction and the transverse direction of the MEMS actuator device 100 can be detected independently.

Figure 2:
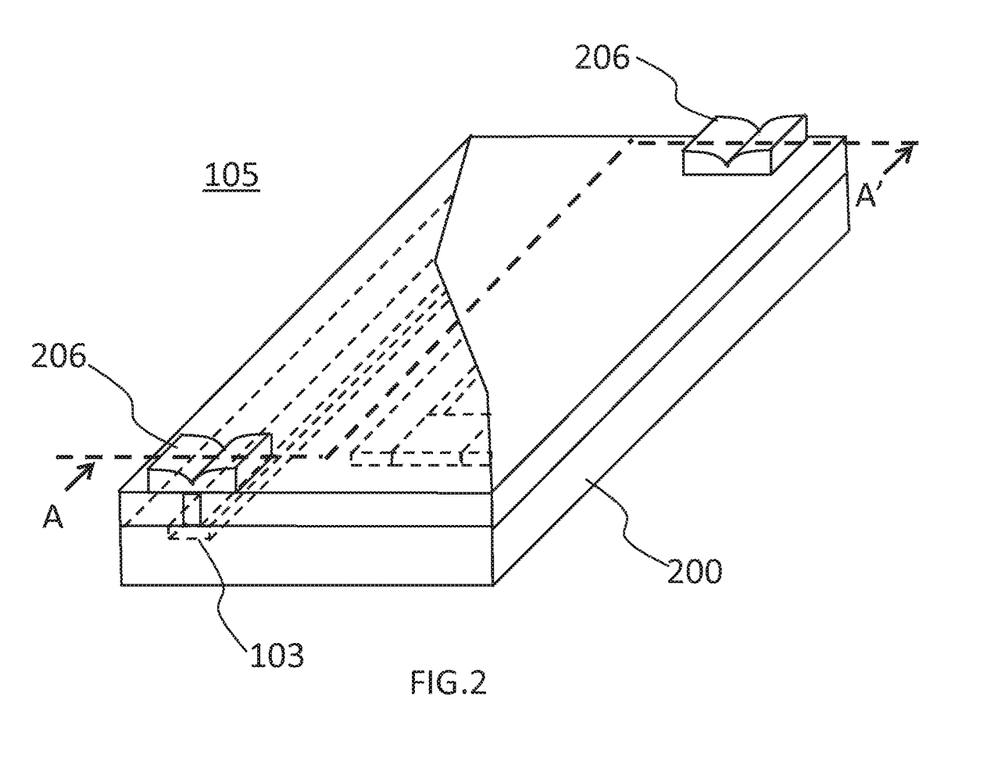
FIG. 2 is a view showing the structure of a semiconductor strain detection element.

FIG. 2 shows the schematic structure of a semiconductor strain detection element 105 provided at the support portion 101 shown in FIG. 1. The semiconductor strain detection element 105 shown here has a structure in which a P-type impurity layer is formed in an N-type silicon substrate 200 by using an ion implantation device.

Figure 3:
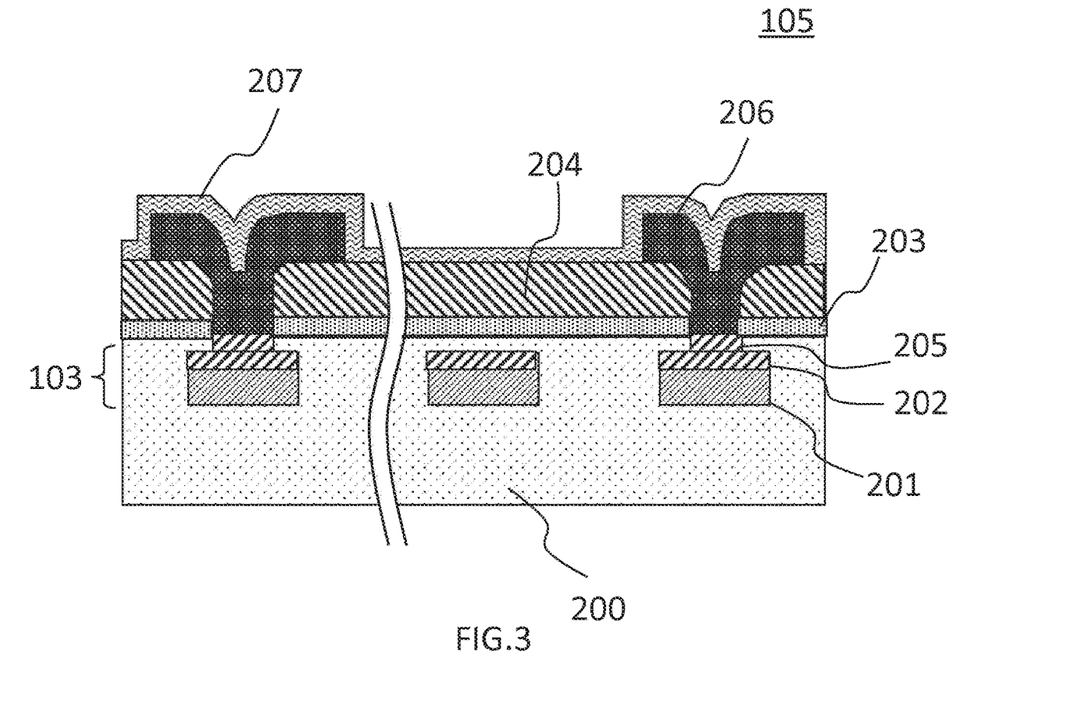
FIG. 3 is a sectional view of a semiconductor strain detection element according to the first embodiment of the present disclosure.

FIG. 3 shows the sectional structure of the semiconductor strain detection element at part A-A' in FIG. 2.

As shown in FIG. 3, the semiconductor strain detection element has, in the N-type silicon substrate 200, a P-type impurity layer 103 in which a first P-type impurity diffusion layer 201 and a second P-type impurity diffusion layer 202 are layered.

In the present embodiment, as described later, a plurality of P-type impurity diffusion layers having different impurity ion densities are formed in the N-type silicon substrate 200, and these P-type impurity diffusion layers are collectively referred to as P-type impurity layer 103.

On the surface of the N-type silicon substrate 200, a thermal oxidization film 203 and an inter-layer insulation film 204 are formed, and contact halls are formed at some parts there. Via the openings of the contact halls, impurity layers 205 for ohmic contact formation are formed, and then metal wiring layers 206 for taking out electrodes are formed.

Finally, an insulation film 207 for protecting elements is formed in the uppermost layer.

The metal wiring layers 206 are formed at the left near side and the right far side in FIG. 2, and the P-type impurity layer 103 connecting between these is arranged in a reverse S shape as seen from the top surface in FIG. 2. In the semiconductor strain detection element 105, change in the resistance of the P-type impurity layer 103 having the reverse S shape is measured to detect strain.

<Process for Manufacturing Semiconductor Strain Detection Element>

With reference to FIG. 4A to FIG. 5C, a process for manufacturing the semiconductor strain detection element 105 according to the present embodiment will be described.

In the description of the process here, the case where the N-type silicon substrate 200 is used and the P-type impurity layer 103 is formed in the substrate using B$^+$ (boron ion) as a dopant will be described. However, another P-type impurity may be used as a dopant.

Alternatively, using a P-type silicon substrate that is a different conduction type and using an N-type dopant such as P$^-$ (phosphorus ion), an N-type impurity layer may be formed in the P-type silicon substrate. Also in this case, the semiconductor strain detection element 105 that provides the same effect can be obtained.

Here, film thicknesses of constituent parts, manufacturing conditions, and the like described in the process for manufacturing the semiconductor strain detection element are merely an example, and are not limited to the film thickness, the manufacturing conditions, and the like described here. It is necessary to set appropriate conditions by performing examinations for each conduction type of substrates and each kind of impurity ions to be implanted.

(1) Formation of Thermal Oxidization Film

Figure 4A:
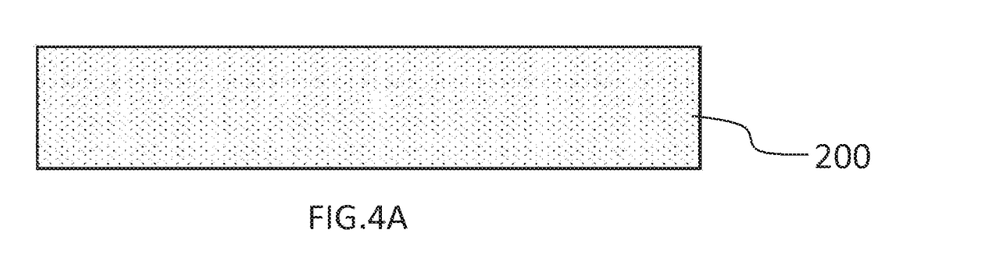
FIGS. 4A to 4D are sectional views illustrating a process for manufacturing the semiconductor strain detection element according to the first embodiment.
Figure 4B:
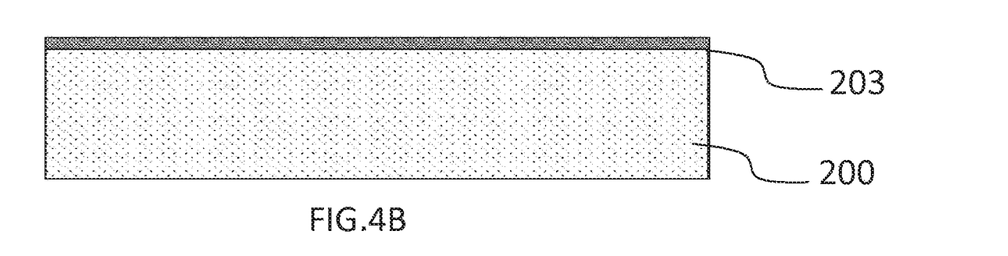

The N-type silicon substrate 200 shown in FIG. 4A is prepared. On the entire surface of the N-type silicon substrate 200, the thermal oxidization film 203 is formed as shown in FIG. 4B.

In the thermal oxidization, heating was performed at about 1000° C. in an oxygen atmosphere. The thickness of the thermal oxidization film was about 0.3 μm.

(2) Formation of P-Type Impurity Layer

First, a resist pattern (not shown) is formed so as to be opened at a desired position on the N-type silicon substrate 200, using photomechanical process technology. It is preferable that the opening position is set so as to allow the P-type impurity layer 103 to be formed at a part where strain is most likely to occur, in the case of being mounted in the MEMS actuator device 100.

Figure 4C:
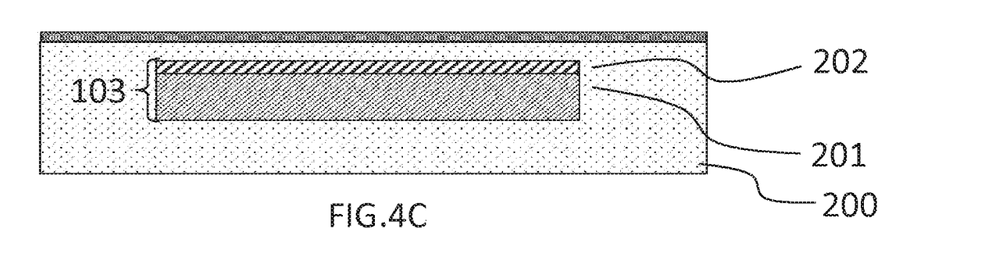

Using the ion implantation device through the opening, as shown in FIG. 4C, the first P-type impurity diffusion layer 201 is formed, and then the second P-type impurity diffusion layer 202 is formed in the same region as the first P-type impurity diffusion layer 201. The first and second P-type impurity diffusion layers 201, 202 are formed at a part where strain such as bending or torsion is most likely to occur in the case where the semiconductor strain detection element 105 is provided at the support portion 101 of the MEMS actuator device 100 as described above, whereby the semiconductor strain detection element 105 with high sensitivity can be obtained. The first P-type impurity diffusion layer 201 and the second P-type impurity diffusion layer 202 formed at this stage constitute the P-type impurity layer 103 together.

The formation of the first P-type impurity diffusion layer 201 and the second P-type impurity diffusion layer 202 was performed by doping B$^+$, using a medium current ion implantation device. In the present embodiment, the first P-type impurity diffusion layer 201 was formed with an implantation amount of $3.5 \times 10^{13}$ cm$^{-2}$ and implantation energy of 80 keV, and the second P-type impurity diffusion layer 202 was formed with an implantation amount of $3.5 \times 10^{13}$ cm$^{-2}$ and implantation energy of 50 keV.

Regarding the B$^+$ density distribution in the depth direction, description will be given later, using a calculated value and an actual measured value. In the impurity distribution in the depth direction in the case of forming the first and second P-type impurity diffusion layers 201, 202 using B$^+$ in the N-type silicon substrate 200, in general, the greater the implantation energy is, the deeper the implantation can reach.

In the present embodiment, after implantation of the first P-type impurity diffusion layer 201, B$^+$ is implanted with reduced implantation energy for the second P-type impurity diffusion layer 202. Therefore, as shown in FIG. 4C, in the N-type silicon substrate 200, the first P-type impurity diffusion layer 201 is formed and then the second P-type impurity diffusion layer 202 is formed in an overlapping manner at a shallow part of the first P-type impurity diffusion layer 201.

(3) Formation of Metal Wiring

On the thermal oxidization film 203 formed on the surface of the N-type silicon substrate 200, the inter-layer insulation film 204 is formed using plasma-enhanced CVD (PECVD) technology. By the inter-layer insulation film 204, and the thermal oxidization film 203 formed in the first step, the metal wiring layer 206 to be formed in an upper layer and the surface of the N-type silicon substrate 200 can be prevented from being short-circuited.

Figure 4D:
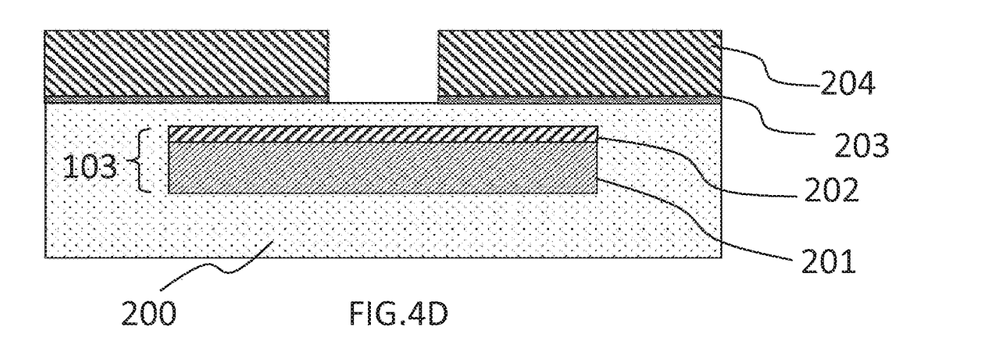
Figure 5A:
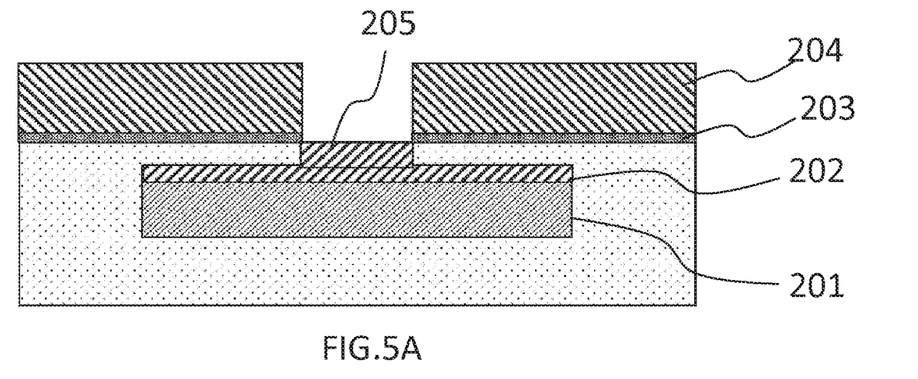
FIGS. 5A to 5C are sectional views illustrating the process for manufacturing the semiconductor strain detection element according to the first embodiment.

As shown in FIG. 4D, a contact hall is formed in the inter-layer insulation film 204 and the thermal oxidization film 203, using photomechanical process technology. Then, a P-type impurity, e.g., BF$_2$ (boron difluoride), is implanted to the contact hall opening part with an implantation amount of $8.0 \times 10^{14}$ cm$^{-2}$ and implantation energy of 40 keV, to form the impurity layer 205 for ohmic contact formation, at a surface part of the N-type silicon substrate 200, as shown in FIG. 5A.

In this step, the P-type impurity ion such as BF$_2$ is implanted in the N-type silicon substrate 200 through the contact hall opening part, thereby establishing stable electric connection between the metal wiring layer 206 and the first and second P-type impurity diffusion layers 201, 202.

Figure 5B:
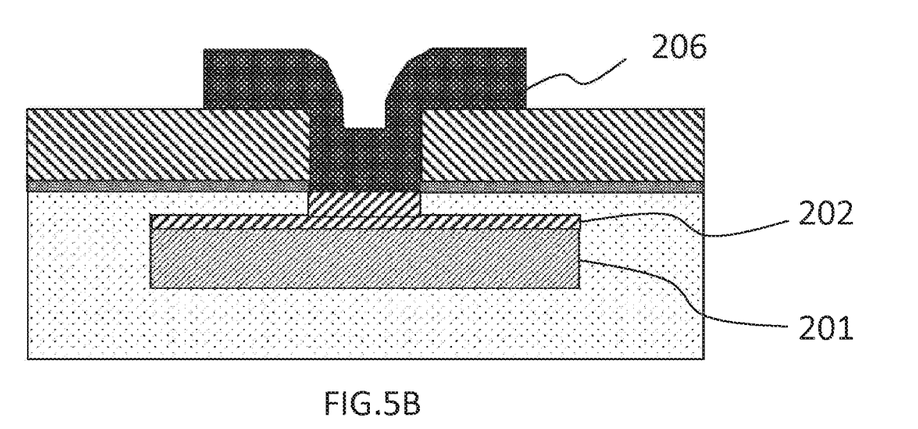

As shown in FIG. 5B, from the top surface of the semiconductor strain detection element 105, the metal wiring layer 206 for sending a signal to a processing circuit is formed and patterning is performed in a desired wiring shape. It is most preferable that the metal wiring layer 206 is made of a low-resistance metal material such as aluminum, titanium, or copper. Alternatively, a metal compound such as metal silicide film or metal nitride film may be used.

Figure 5C:
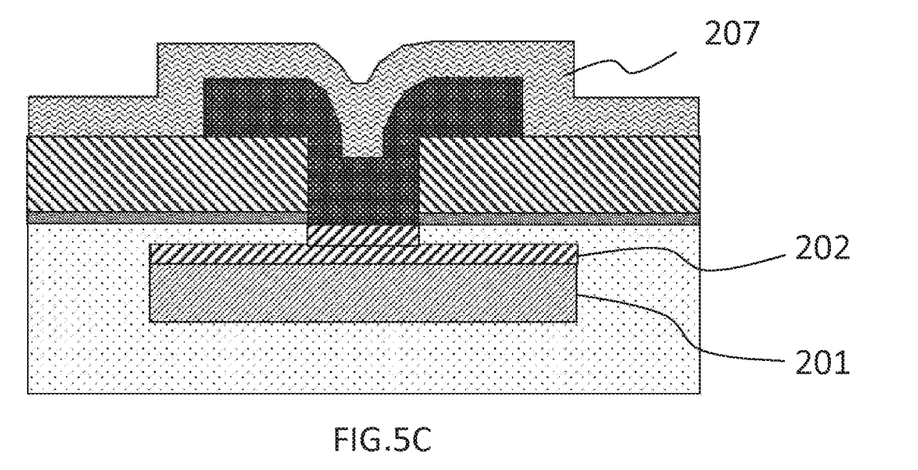

Finally, the insulation film 207 for protecting elements is formed over the entire surface of the semiconductor strain detection element 105 as shown in FIG. 5C. Thus, manufacturing of the semiconductor strain detection element 105 is completed.

<Impurity Ion Density Distribution>

In the present embodiment, an evaluation sample was prepared by the same manufacturing process as in the present embodiment, in order to measure the distribution of the impurity ion density. That is, B+ was doped in the N-type silicon substrate 200 by a medium current ion implantation device, and the first P-type impurity diffusion layer 201 and the second P-type impurity diffusion layer 202 were formed as in the substrate shown in FIG. 4C.

The implantation condition was as follows. For the first P-type impurity diffusion layer 201, the implantation amount was $3.5 \times 10^{13}$ cm$^{-2}$ and the implantation energy was 80 keV, and for the second P-type impurity diffusion layer 202, the implantation amount was $3.5 \times 10^{13}$ cm$^{-2}$ and the implantation energy was 50 keV. In order to activate the impurities contained in the first and second P-type impurity diffusion layers 201, 202, heat treatment was performed at a maximum temperature of 980° C. for 270 minutes using a horizontal heat treatment furnace.

Figure 6:
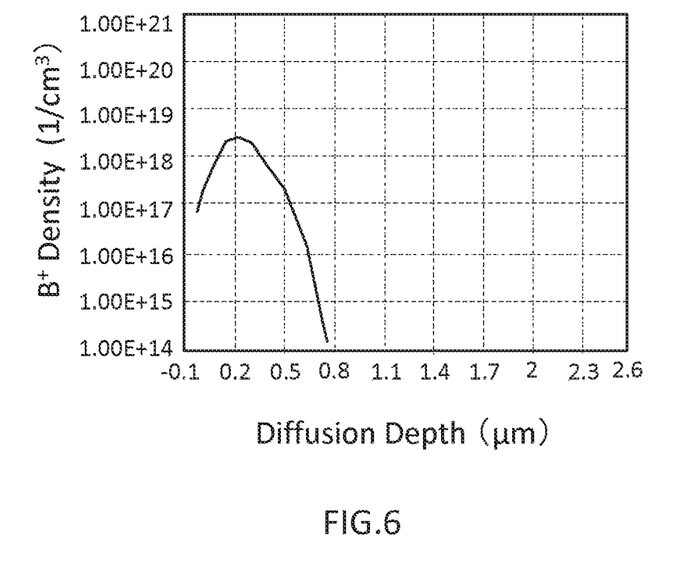
FIG. 6 shows an impurity ion density distribution (calculated value) in the semiconductor strain detection element according to the first embodiment.
Figure 7:
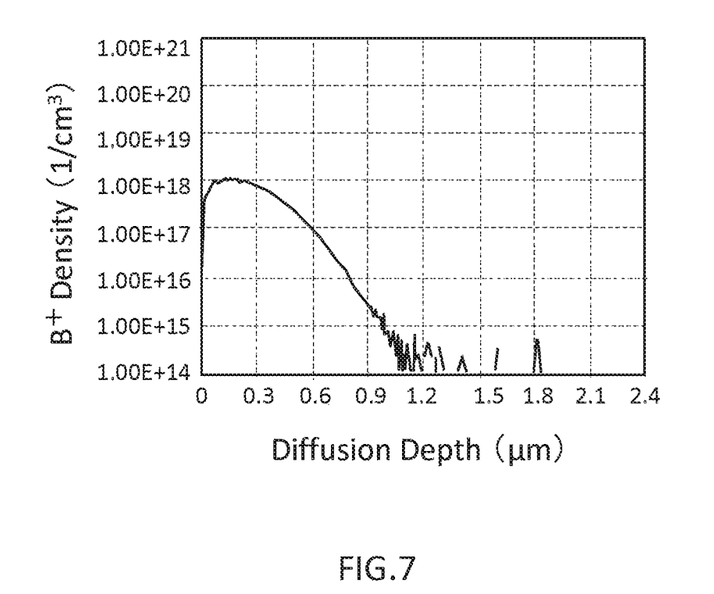
FIG. 7 shows an impurity ion density distribution (actual measured value) in the semiconductor strain detection element according to the first embodiment.

Regarding the sample prepared here, FIG. 6 shows a result of calculation of the P-type impurity ion density distribution in the depth direction in the N-type silicon substrate 200 by one-dimensional simulation, and FIG. 7 shows a result of measurement by secondary ion mass spectrometry (SIMS).

In both figures, the vertical axis indicates B+ density (1/cm$^3$), the horizontal axis indicates the diffusion depth (μm), and 0 μm in the diffusion depth indicates the surface of the N-type silicon substrate 200.

The one-dimensional simulation of the impurity distribution shown in FIG. 6 and the actual measured value shown in FIG. 7 basically indicate the same result. It is found that, as the depth increases from the substrate surface at a depth of 0 μm, the impurity ion density increases once and the impurity ion density becomes the highest at a depth of about 0.2 μm, and then, as the depth further increases, the impurity ion density decreases.

That is, as shown in FIG. 4C, first, the first P-type impurity diffusion layer 201 is formed at an embedded position under the surface of the N-type silicon substrate 200. Then, the second P-type impurity diffusion layer 202 is formed in an overlapping manner at a shallow part near the surface, in the first P-type impurity diffusion layer 201. As a result, the P-type impurity layer 103 embedded at a position of 0.2 μm from the surface of the N-type silicon substrate 200 and having a high impurity ion density is formed.

From the above, it can be said that the second P-type impurity diffusion layer 202 is formed on the first P-type impurity diffusion layer 201 and the entire P-type impurity layer 103 including the first and second P-type impurity diffusion layers 201, 202 is completely enclosed in the N-type silicon substrate 200.

<Effect of Semiconductor Strain Detection Element>

The semiconductor strain detection element 105 according to the present embodiment has a sectional structure shown in FIG. 5C, in which the P-type impurity layer 103 including the first P-type impurity diffusion layer 201 and the second P-type impurity diffusion layer 202 is completely enclosed in the N-type silicon substrate 200. Thus, the P-type impurity layer 103 is ensured as a stable conduction path for carriers, and high sensitivity for strain detection is ensured.

In addition, the impurity ion density is high at a shallow part in the P-type impurity layer 103. Therefore, it is considered that the conduction path for carriers is pushed down by the impurity ions so as to be located closer to a center part in the P-type impurity layer 103. Thus, the distance from the interface between the N-type silicon substrate 200 and the oxide film, which is considered to be a noise source, to the conduction path for carriers, is increased, so that the noise influence decreases and the S/N ratio is improved.

It is noted that the effect obtained in the present embodiment can be obtained in the same manner also in the semiconductor strain detection element 105 configured to be a reverse conduction type by forming an N-type impurity layer in a P-type silicon substrate.

As the silicon substrate, a silicon substrate having an insulation layer in the substrate as in silicon on insulator (SOI) technology can also be used in the same manner, and the first impurity diffusion layer 201 can be formed inside the surface-side silicon substrate.

Second Embodiment

A semiconductor strain detection element 105 according to the second embodiment of the present disclosure is used in the MEMS actuator device 100 shown in FIG. 1 as in the first embodiment, and has the same structure as the semiconductor strain detection element 105 shown in FIG. 2 and FIG. 3 in the first embodiment. Also, the manufacturing process is basically the same as that shown in FIG. 4A to FIG. 5C in the first embodiment.

The present embodiment is different in the structure of the P-type impurity layer 103 formed in the N-type silicon substrate 200 shown in FIG. 4C in the first embodiment.

Figure 8:
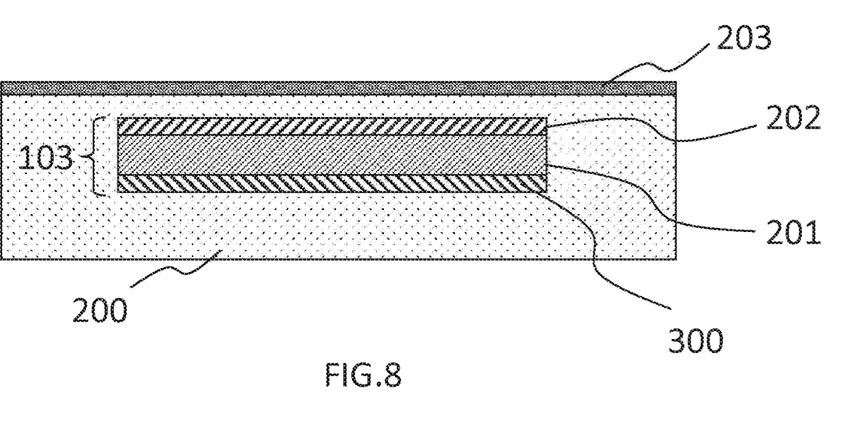
FIG. 8 is a sectional view of a semiconductor strain detection element according to the second embodiment of the present disclosure.

FIG. 8 schematically shows a sectional structure of the P-type impurity layer 103 formed in the N-type silicon substrate 200 according to the present embodiment.

First, as in the first embodiment, a resist pattern is formed so as to be opened at a desired position on the N-type silicon substrate 200, using photomechanical process technology. It is preferable that the opening is formed at a part where strain is most likely to occur, in the case of being mounted in the MEMS actuator device 100.

Also in the present embodiment, the entire impurity layer including a plurality of layers formed in the N-type silicon substrate 200 is collectively referred to as P-type impurity layer 103.

<Process for Forming P-Type Impurity Layer>

First, as in the first embodiment, B+ is doped using a medium current ion implantation device, to form the first P-type impurity diffusion layer 201 and then the second P-type impurity diffusion layer 202.

The ion implantation condition is also the same as in the first embodiment. That is, the first P-type impurity diffusion layer 201 was formed with an implantation amount of $3.5 \times 10^{13}$ cm$^{-2}$ and implantation energy of 80 keV, and the second P-type impurity diffusion layer 202 was formed with an implantation amount of $3.5 \times 10^{13}$ cm$^{-2}$ and implantation energy of 50 keV.

Next, a third P-type impurity diffusion layer 300 is formed using B$^+$ by the medium current ion implantation device.

The third P-type impurity diffusion layer 300 was formed with an implantation amount of $3.5 \times 10^{13}$ cm$^{-2}$ and implantation energy of 120 keV.

<Impurity Ion Density Distribution>

The impurity distribution in the depth direction in the N-type silicon substrate 200 in which the P-type impurity layer 103 was formed was measured. As in the first embodiment, as the depth from the substrate surface increased, the impurity ion density increased once, and the impurity ion density became the highest at a depth of about 0.2 μm. Then, as the depth further increased, the impurity ion density gradually decreased, and thereafter, the impurity ion density increased again from a position where the depth from the surface of the N-type silicon substrate 200 was about 0.35 μm.

From the above measurement result, it is considered that the first P-type impurity diffusion layer 201 was formed at an embedded position under the surface of the N-type silicon substrate 200. In addition, it is considered that, as a result of the subsequent formation of the second P-type impurity diffusion layer 202 in an overlapping manner at a shallow part near the surface in the first P-type impurity diffusion layer 201, a region having a high impurity ion density was formed at a position of 0.2 μm from the surface of the N-type silicon substrate 200. Further, in the present embodiment, it is considered that, as a result of the formation of the third P-type impurity diffusion layer 300 in an overlapping manner at a deep part of the first P-type impurity diffusion layer 201, a region having a high impurity ion density was formed at a depth of 0.35 μm from the surface of the N-type silicon substrate 200.

In the present embodiment, as shown in FIG. 8, it is considered that the P-type impurity layer 103 in which the first P-type impurity diffusion layer 201 is sandwiched between the second P-type impurity diffusion layer 202 and the third P-type impurity diffusion layer 300 having high impurity ion densities from the upper and lower sides is formed at an embedded position under the surface of the N-type silicon substrate 200, and the entire P-type impurity layer 103 including the first, second, and third P-type impurity diffusion layers 201, 202, 300 is completely enclosed in the N-type silicon substrate 200.

<Effect of Semiconductor Strain Detection Element>

As shown in FIG. 8, the P-type impurity layer 103 of the semiconductor strain detection element 105 according to the present embodiment is completely enclosed in the N-type silicon substrate 200. Thus, the P-type impurity layer 103 is ensured as a stable conduction path for carriers, and high sensitivity for strain detection is ensured.

Further, in the P-type impurity layer 103, the first P-type impurity diffusion layer 201 is sandwiched between the second and third P-type impurity diffusion layers 202, 300 having high impurity ion densities from the upper and lower sides. Thus, the conduction path for carriers is located closer to a center part in the impurity layer, and the distance from the interface between the N-type silicon substrate 200 and the oxide film, which is considered to be a noise source, to the conduction path for carriers, is very long. Therefore, the noise influence is small and the S/N ratio is improved.

It is noted that the effect in the present embodiment can be obtained in the same manner also in the semiconductor strain detection element configured to be a reverse conduction type by forming an N-type impurity layer in a P-type silicon substrate.

As the silicon substrate, a silicon substrate having an insulation layer in the substrate as in SOI technology can also be used in the same manner.

Third Embodiment

A semiconductor strain detection element 105 according to the third embodiment of the present disclosure is used in the MEMS actuator device 100 shown in FIG. 1 as in the first embodiment, and has the same structure as the semiconductor strain detection element 105 shown in FIG. 2 and FIG. 3 in the first embodiment. Also, the manufacturing process is basically the same as that shown in FIG. 4A to FIG. 5C in the first embodiment.

The present embodiment is different in the structure of the P-type impurity layer 103 formed in the N-type silicon substrate 200 shown in FIG. 4C in the first embodiment.

Figure 9:
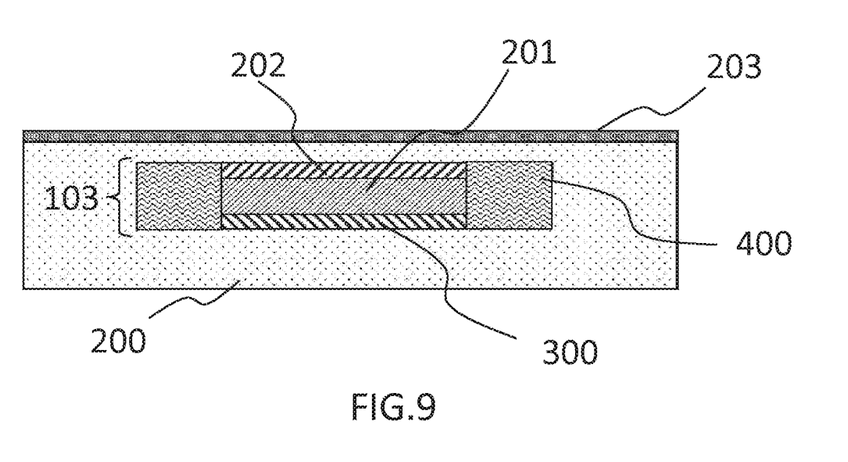
FIG. 9 is a sectional view of a semiconductor strain detection element according to the third embodiment of the present disclosure.

FIG. 9 schematically shows the structure of the P-type impurity layer 103 formed in the N-type silicon substrate 200 according to the present embodiment.

First, as in the first and second embodiments, a resist pattern is formed so as to be opened at a desired position on the N-type silicon substrate 200, using photomechanical process technology, and the P-type impurity layer 103 is formed through the opening.

<Process for Forming P-Type Impurity Layer>

First, as in the second embodiment, B$^+$ is doped using a medium current ion implantation device, to form the first P-type impurity diffusion layer 201, and then the second P-type impurity diffusion layer 202 and the third P-type impurity diffusion layer 300.

Parameters in each implantation step are the same as in the second embodiment. That is, the first P-type impurity diffusion layer 201 was formed with an implantation amount of $3.5 \times 10^{13}$ cm$^{-2}$ and implantation energy of 80 keV, the second P-type impurity diffusion layer 202 was formed with an implantation amount of $3.5 \times 10^{13}$ cm$^{-2}$ and implantation energy of 50 keV, and the third P-type impurity diffusion layer 300 was formed with an implantation amount of $3.5 \times 10^{13}$ cm$^{-2}$ and implantation energy of 120 keV.

At this stage, the first P-type impurity diffusion layer 201 is sandwiched between the second and third P-type impurity diffusion layers 202, 300 having high impurity ion densities from the upper and lower sides, and the P-type impurity layer 103 is formed at an embedded position under the surface of the N-type silicon substrate 200.

Next, by a high current ion implantation device, ion implantation using BF$_2$ is performed on lateral surfaces of the P-type impurity layer 103, with an implantation amount of $1.0 \times 10^{15}$ cm$^{-2}$ and implantation energy of 140 keV, to form a fourth P-type high-density impurity diffusion layer 400.

Here, in the ion implantation by the high current ion implantation device, BF$_2$ has been used as the implantation source. However, another P-type impurity ion can also be used in the same manner by adjusting the implantation amount and the implantation energy.

<Impurity Ion Density Distribution>

As in the second embodiment, the P-type impurity layer 103 formed in the N-type silicon substrate 200 has a structure in which the first P-type impurity diffusion layer 201 is sandwiched between the second and third P-type impurity diffusion layers 202, 300 from the upper and lower sides, and regions having high impurity ion densities are formed at depths of about 0.2 μm and about 0.35 μm from the surface of the N-type silicon substrate 200.

Further, in the present embodiment, as shown in the sectional structure in FIG. 9, the fourth P-type high-density impurity diffusion layers 400 are formed at both lateral ends of the P-type impurity layer 103.

<Effect of Semiconductor Strain Detection Element>

As shown in FIG. 9, the P-type impurity layer 103 of the semiconductor strain detection element 105 according to the present embodiment is completely enclosed in the N-type silicon substrate 200. Thus, the P-type impurity layer 103 is ensured as a stable conduction path for carriers, and high sensitivity for strain detection is ensured.

Further, in the P-type impurity layer 103, the first P-type impurity diffusion layer 201 is sandwiched between the second and third P-type impurity diffusion layers 202, 300 having high impurity ion densities from the upper and lower sides, and sandwiched between the fourth P-type high-density impurity diffusion layers 400 from both lateral ends. Thus, the conduction path for carriers is located closer to a center part in the impurity layer, and the distance from the interface between the N-type silicon substrate 200 and the oxide film, which is considered to be a noise source, to the conduction path for carriers, is very long. Therefore, the noise influence is small and the S/N ratio is improved.

In addition, the fourth P-type high-density impurity diffusion layer 400 functions as a gettering layer for capturing contamination impurities in the N-type silicon substrate 200. Thus, noise in the output of the semiconductor strain detection element 105 is further reduced and the S/N ratio is improved.

It is noted that the effect in the present embodiment can be obtained in the same manner also in the semiconductor strain detection element configured to be a reverse conduction type by forming an N-type impurity layer in a P-type silicon substrate.

As the silicon substrate, a silicon substrate having an insulation layer in the substrate as in SOI technology can also be used in the same manner.

In the present embodiment, the P-type impurity layer 103 is formed such that the periphery is surrounded by the second and third P-type impurity diffusion layers 202, 300 and the fourth P-type high-density impurity diffusion layer 400 having high impurity ion densities. Conversely, a P-type impurity layer having a higher impurity ion density that the periphery may be formed near the center of the P-type impurity layer 103, and a P-type impurity layer having a lower impurity ion density may be formed around the periphery. Even in this case, the semiconductor strain detection element 105 having a high S/N ratio can be obtained.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

100 MEMS actuator device
101 support portion
102 micro-mirror
103 P-type impurity layer
105 semiconductor strain detection element
200 N-type silicon substrate
201 first P-type impurity diffusion layer
202 second P-type impurity diffusion layer
203 thermal oxidization film
204 inter-layer insulation film
205 impurity layer for ohmic contact formation
206 metal wiring layer
207 insulation film
300 third P-type impurity diffusion layer
400 fourth P-type high-density impurity diffusion layer

What is claimed is:

1. A semiconductor strain detection element comprising:
a silicon substrate; and
an impurity layer having a conduction type different from the silicon substrate, the impurity layer being formed inside under a surface of the silicon substrate, wherein
the impurity layer includes a first impurity diffusion layer and a second impurity diffusion layer,
the second impurity diffusion layer is formed on a silicon-substrate-surface side of the first impurity diffusion layer, the second impurity diffusion layer having a higher impurity ion density than the first impurity diffusion layer and having the same conduction type as the first impurity diffusion layer, and
an amount of strain in the silicon substrate is detected on the basis of change in a resistance of the first impurity diffusion layer.

2. The semiconductor strain detection element according to claim 1, wherein the impurity layer further includes a third impurity diffusion layer, the third impurity diffusion layer is formed on a side of the first impurity diffusion layer that is opposite to the second impurity diffusion layer, the third impurity diffusion layer having a higher impurity ion density than the first impurity diffusion layer and having the same conduction type as the first impurity diffusion layer.

3. The semiconductor strain detection element according to claim 2, wherein the impurity layer further includes a fourth impurity diffusion layer, the fourth impurity diffusion layer is formed at a lateral surface part of the first impurity diffusion layer, the fourth impurity diffusion layer having a higher impurity ion density than the first impurity diffusion layer and having the same conduction type as the first impurity diffusion layer.

4. The semiconductor strain detection element according to claim 3, wherein
the conduction type of the silicon substrate is N-type, and
the conduction type of the first impurity diffusion layer is P-type.

5. The semiconductor strain detection element according to claim 3, wherein
the conduction type of the silicon substrate is P-type, and
the conduction type of the first impurity diffusion layer is N-type.

6. The semiconductor strain detection element according to claim 3, wherein
the silicon substrate is an SOI substrate having an insulation film therein, and
the impurity layer is formed inside a surface-side silicon substrate of the SOI substrate.

7. A MEMS actuator device comprising, as one of sensors, the semiconductor strain detection element according to claim 3.

8. The semiconductor strain detection element according to claim 2, wherein
the conduction type of the silicon substrate is N-type, and the conduction type of the first impurity diffusion layer is P-type.

9. The semiconductor strain detection element according to claim 2, wherein
the conduction type of the silicon substrate is P-type, and the conduction type of the first impurity diffusion layer is N-type.

10. The semiconductor strain detection element according to claim 2, wherein
the silicon substrate is an SOI substrate having an insulation film therein, and
the impurity layer is formed inside a surface-side silicon substrate of the SOI substrate.

11. A MEMS actuator device comprising, as one of sensors, the semiconductor strain detection element according to claim 2.

12. The semiconductor strain detection element according to claim 1, wherein
the conduction type of the silicon substrate is N-type, and the conduction type of the first impurity diffusion layer is P-type.

13. The semiconductor strain detection element according to claim 1, wherein
the conduction type of the silicon substrate is P-type, and the conduction type of the first impurity diffusion layer is N-type.

14. The semiconductor strain detection element according to claim 1, wherein
the silicon substrate is an SOI substrate having an insulation film therein, and
the impurity layer is formed inside a surface-side silicon substrate of the SOI substrate.

15. A MEMS actuator device comprising, as one of sensors, the semiconductor strain detection element according to claim 1.

* * * * *